(12) United States Patent
Shepard

(10) Patent No.: US 8,358,525 B2
(45) Date of Patent: *Jan. 22, 2013

(54) LOW COST HIGH DENSITY RECTIFIER MATRIX MEMORY

(75) Inventor: Daniel R. Shepard, North Hampton, NH (US)

(73) Assignee: Contour Semiconductor, Inc., N. Billerica, MA (US)

( * ) Notice: Subject to any disclaimer, the term of this patent is extended or adjusted under 35 U.S.C. 154(b) by 13 days.

This patent is subject to a terminal disclaimer.

(21) Appl. No.: 12/898,205

(22) Filed: Oct. 5, 2010

(65) Prior Publication Data

US 2011/0019455 A1 Jan. 27, 2011

Related U.S. Application Data

(60) Continuation of application No. 11/780,909, filed on Jul. 20, 2007, now Pat. No. 7,826,244, which is a continuation of application No. 11/229,941, filed on Sep. 19, 2005, now Pat. No. 7,460,384, which is a division of application No. 09/887,201, filed on Jun. 22, 2001, now Pat. No. 6,956,757.

(60) Provisional application No. 60/213,419, filed on Jun. 22, 2000.

(51) Int. Cl.
G11C 5/02 (2006.01)
(52) U.S. Cl. .................. 365/51; 365/163; 365/230.06
(58) Field of Classification Search .................. 365/51, 365/163, 113, 230.06; 438/95
See application file for complete search history.

(56) References Cited

U.S. PATENT DOCUMENTS

| | | | |
|---|---|---|---|
| 2,709,042 A | 5/1955 | Couffignal |
| 3,091,754 A | 5/1963 | Nazare |
| 3,245,051 A | 4/1966 | Robb |
| 3,308,433 A | 3/1967 | Lochinger |
| 3,373,406 A | 3/1968 | Cannon et al. |
| 3,576,549 A | 4/1971 | Hess et al. |
| 3,626,389 A | 12/1971 | Waaben |
| 3,701,119 A | 10/1972 | Waaben et al. |
| 3,721,964 A | 3/1973 | Barrett et al. |
| 3,806,896 A | 4/1974 | Mar |
| 3,838,405 A | 9/1974 | Arnett et al. |
| 3,942,071 A | 3/1976 | Krebs et al. |
| 4,010,453 A | 3/1977 | Lewis |
| 4,070,654 A | 1/1978 | Tachi |
| 4,090,190 A | 5/1978 | Rostkovsky et al. |
| 4,240,151 A | 12/1980 | Kawagoe |
| 4,308,595 A | 12/1981 | Houghton |

(Continued)

FOREIGN PATENT DOCUMENTS

DE 1011454 A1 7/1957

(Continued)

OTHER PUBLICATIONS

International Search Report and Written Opinion for PCT/US2009/045931, dated Jan. 21, 2010, 15 pages.

(Continued)

*Primary Examiner* — Toan Le
(74) *Attorney, Agent, or Firm* — Bingham McCutchen LLP

(57) ABSTRACT

A high density memory device is fabricated three dimensionally in layers. To keep points of failure low, address decoding circuits are included within each layer so that, in addition to power and data lines, only the address signal lines need be interconnected between the layers.

8 Claims, 4 Drawing Sheets

FRONT VIEW

SIDE VIEW

U.S. PATENT DOCUMENTS

| | | |
|---|---|---|
| 4,312,046 A | 1/1982 | Taylor |
| 4,322,822 A | 3/1982 | McPherson |
| 4,342,102 A | 7/1982 | Puar |
| 4,347,585 A | 8/1982 | Eardley |
| 4,385,368 A | 5/1983 | Principi et al. |
| 4,394,752 A | 7/1983 | Boudon et al. |
| 4,404,480 A | 9/1983 | Ransom et al. |
| 4,419,471 A | 12/1983 | Nelsen et al. |
| 4,424,579 A | 1/1984 | Roesner |
| 4,442,507 A | 4/1984 | Roesner |
| 4,479,200 A | 10/1984 | Sato et al. |
| 4,525,921 A | 7/1985 | Carson et al. |
| 4,534,008 A | 8/1985 | Fuchs et al. |
| 4,554,640 A | 11/1985 | Wong et al. |
| 4,561,070 A | 12/1985 | Armstrong |
| 4,608,672 A | 8/1986 | Roberts et al. |
| 4,646,128 A | 2/1987 | Carson et al. |
| 4,646,266 A | 2/1987 | Ovshinsky et al. |
| 4,661,927 A | 4/1987 | Graebel |
| 4,710,900 A | 12/1987 | Higuchi |
| 4,721,885 A | 1/1988 | Brodie |
| 4,757,475 A | 7/1988 | Awaya |
| 4,772,886 A | 9/1988 | Hasegawa |
| 4,782,340 A | 11/1988 | Czubatyj et al. |
| 4,800,529 A | 1/1989 | Ueno |
| 4,845,679 A | 7/1989 | Vu |
| 4,884,238 A | 11/1989 | Lee et al. |
| 4,888,631 A | 12/1989 | Azuma et al. |
| 4,920,516 A | 4/1990 | Tsuchimoto |
| 5,051,865 A | 9/1991 | Kato et al. |
| 5,095,355 A | 3/1992 | Shiomi et al. |
| 5,148,256 A | 9/1992 | Potash et al. |
| 5,163,328 A | 11/1992 | Holland et al. |
| 5,203,731 A | 4/1993 | Zimmerman |
| 5,296,716 A | 3/1994 | Ovshinsky et al. |
| 5,357,471 A | 10/1994 | Alapat |
| 5,390,145 A | 2/1995 | Nakasha et al. |
| 5,397,957 A | 3/1995 | Zimmerman |
| 5,432,729 A | 7/1995 | Carson et al. |
| 5,441,907 A | 8/1995 | Sung et al. |
| 5,463,269 A | 10/1995 | Zimmerman |
| 5,463,583 A | 10/1995 | Takashina |
| 5,493,533 A | 2/1996 | Lambrache |
| 5,569,973 A | 10/1996 | Zimmerman |
| 5,576,986 A | 11/1996 | Matsuzaki et al. |
| 5,640,343 A | 6/1997 | Gallagher et al. |
| 5,668,032 A | 9/1997 | Holmberg et al. |
| 5,673,218 A | 9/1997 | Shepard |
| 5,675,531 A | 10/1997 | McClelland et al. |
| 5,700,626 A | 12/1997 | Lee et al. |
| 5,719,589 A | 2/1998 | Norman et al. |
| 5,740,099 A | 4/1998 | Tanigawa |
| 5,807,791 A * | 9/1998 | Bertin et al. ............... 438/738 |
| 5,835,396 A | 11/1998 | Zhang |
| 5,837,564 A | 11/1998 | Sandhu et al. |
| 5,840,608 A | 11/1998 | Chang |
| 5,889,694 A | 3/1999 | Shepard |
| 5,933,364 A | 8/1999 | Aoyama et al. |
| 5,998,828 A | 12/1999 | Ueno et al. |
| 6,055,180 A | 4/2000 | Gudesen et al. |
| 6,075,723 A | 6/2000 | Naiki et al. |
| 6,088,252 A | 7/2000 | Fujisawa et al. |
| 6,117,720 A | 9/2000 | Harshfield |
| 6,133,640 A | 10/2000 | Leedy |
| 6,163,475 A | 12/2000 | Proebsting |
| 6,185,122 B1 | 2/2001 | Johnson et al. |
| 6,198,682 B1 | 3/2001 | Proebsting |
| 6,236,587 B1 | 5/2001 | Gudesen et al. |
| 6,256,767 B1 | 7/2001 | Kuekes et al. |
| 6,259,132 B1 | 7/2001 | Pio |
| 6,351,023 B1 | 2/2002 | Gates et al. |
| 6,385,075 B1 | 5/2002 | Taussig et al. |
| 6,424,016 B1 | 7/2002 | Houston |
| 6,459,095 B1 | 10/2002 | Heath et al. |
| 6,462,998 B1 | 10/2002 | Proebsting |
| 6,478,231 B1 | 11/2002 | Taussig |
| 6,492,690 B2 | 12/2002 | Ueno et al. |
| 6,552,409 B2 | 4/2003 | Taussig et al. |
| 6,559,468 B1 | 5/2003 | Kuekes et al. |
| 6,566,217 B1 | 5/2003 | Maki |
| 6,567,295 B2 | 5/2003 | Taussig et al. |
| 6,586,327 B2 | 7/2003 | Shepard |
| 6,587,394 B2 | 7/2003 | Hogan |
| 6,597,037 B1 | 7/2003 | Forbes et al. |
| 6,598,164 B1 | 7/2003 | Shepard |
| 6,613,650 B1 | 9/2003 | Holmberg |
| 6,703,673 B2 | 3/2004 | Houston |
| 6,721,223 B2 | 4/2004 | Matsumoto et al. |
| 6,744,681 B2 | 6/2004 | Hogan |
| 6,768,685 B1 | 7/2004 | Scheuerlein |
| 6,839,260 B2 | 1/2005 | Ishii |
| 6,879,505 B2 | 4/2005 | Scheuerlein |
| 6,956,757 B2 | 10/2005 | Shepard |
| 7,018,904 B2 | 3/2006 | Yamada et al. |
| 7,032,083 B1 | 4/2006 | Jensen et al. |
| 7,054,219 B1 | 5/2006 | Petti et al. |
| 7,088,613 B2 | 8/2006 | Lue et al. |
| 7,149,934 B2 | 12/2006 | Shepard |
| 7,183,206 B2 | 2/2007 | Shepard |
| 7,190,602 B2 | 3/2007 | Johnson et al. |
| 7,242,601 B2 | 7/2007 | Dehon et al. |
| 7,330,369 B2 | 2/2008 | Tran |
| 7,376,008 B2 | 5/2008 | Shepard |
| 7,408,798 B2 | 8/2008 | Bernstein et al. |
| 7,460,384 B2 | 12/2008 | Shepard |
| 7,471,547 B2 | 12/2008 | Schloesser |
| 7,548,453 B2 | 6/2009 | Nestler |
| 7,548,454 B2 | 6/2009 | Nestler |
| 7,554,873 B2 | 6/2009 | Lee et al. |
| 7,592,209 B2 | 9/2009 | Chang |
| 7,593,246 B2 * | 9/2009 | Shepard ............... 365/51 |
| 7,593,256 B2 | 9/2009 | Nestler |
| 7,646,664 B2 | 1/2010 | Cho et al. |
| 2002/0126526 A1 | 9/2002 | Taussig et al. |
| 2002/0184459 A1 | 12/2002 | Taussig et al. |
| 2002/0191434 A1 | 12/2002 | Taussing et al. |
| 2002/0192895 A1 | 12/2002 | Taussig et al. |
| 2002/0196659 A1 | 12/2002 | Hurst et al. |
| 2003/0003633 A1 | 1/2003 | Mei et al. |
| 2003/0026120 A1 | 2/2003 | Scheuerlein |
| 2003/0028699 A1 | 2/2003 | Holtzman et al. |
| 2003/0087495 A1 | 5/2003 | Forbes et al. |
| 2004/0145938 A1 | 7/2004 | Tihanyi |
| 2004/0160805 A1 | 8/2004 | Rinerson et al. |
| 2005/0067675 A1 | 3/2005 | Shepard |
| 2005/0127350 A1 | 6/2005 | Furkay et al. |
| 2006/0072427 A1 | 4/2006 | Kanda et al. |
| 2007/0028150 A1 | 2/2007 | Shepard |
| 2007/0242494 A1 | 10/2007 | Nestler |
| 2007/0247890 A1 | 10/2007 | Shepard |
| 2008/0013354 A1 | 1/2008 | Shepard |
| 2008/0016414 A1 | 1/2008 | Shepard |
| 2009/0109726 A1 | 4/2009 | Shepard |
| 2009/0141535 A1 | 6/2009 | Yang et al. |
| 2009/0161420 A1 | 6/2009 | Shepard |
| 2009/0225579 A1 | 9/2009 | Shepard et al. |
| 2009/0225621 A1 | 9/2009 | Shepard |
| 2009/0296445 A1 | 12/2009 | Shepard |

FOREIGN PATENT DOCUMENTS

| | | |
|---|---|---|
| DE | 1011454 B | 7/1957 |
| JP | 57-203293 A | 12/1982 |
| JP | 57-203294 A | 12/1982 |
| JP | 2-98898 A | 4/1990 |
| WO | WO-99/39394 A1 | 8/1999 |

OTHER PUBLICATIONS

"Summary Page National Radio Institute 832," Old-Computers.com, <http://old-computers.com/museum/computer.asp?c=884&st=1>, (Apr. 4, 2007), 2 pages.

Berger, "Models for Contacts to Planar Devices," Solid-State Electronics, vol. 15, (1972), pp. 145-158.

Crawford, et al. "An Improved Tunnel Diode Memory System," IBM Journal, (Jul. 1963) pp. 199-206.

De Graaf, et al. "A Novel High-Density Low-Cost Diode Programmable Read Only Memory," IEEE IEDM, session 7.6.1, (1996), pp. 189-192.

Hodges, et al. "Analysis and Design of Digital Integrated Circuits," McGraw-Hill Book Company, pp. 27-32.

Hurst, "A Survey of Published Information on Universal Logic Arrays," Microelectronics and Reliability, vol. 16, (1977), pp. 663-674.

International Search Report and Written Opinion for corresponding PCT Application No. PCT/US2007/007792 mailed Oct. 30, 2007 (3 pages).

McConnell, et al. "Diode-Transistor Logic," Digital Electronics, Chapter 5, West Virginia University, (2002), pp. 1-14.

Near, et al. "Read-Only Memory Adds to Calculator's Repertoire," Electronics, (Feb. 3, 1969), pp. 70-77.

Wang, et al, "High-Current-Density Thin-Film Silicon Diodes Grown at Low Temperature," Applied Physics Letters, vol. 85(11), (Sep. 13, 2004), pp. 2122-2124.

Wang, et al, "Low Temperature Thin-Film Silicon Diodes for Consumer Electronics," Mater. Res. Soc. Symp. Proc., vol. 862, (2005), pp. A15.5.1-A15.5.6.

International Search Report in International Application No. PCT/US99/02239, mailed May 31, 1999.

International Search Report and Written Opinion in International Patent Application No. PCT/US07/011020, mailed Jul. 18, 2008 (14 pages).

International Search Report and Written Opinion in International Patent Application No. PCT/US2008/075986, mailed Jan. 22, 2009 (9 pages).

International Search Report and Written Opinion in International Patent Application No. PCT/US2008/082503, mailed Feb. 25, 2009 (10 pages).

Partial International Search Report in International Patent Application No. PCT/US07/011020, mailed Apr. 14, 2008, 6 pages.

* cited by examiner

LOW COST HIGH DENSITY RECTIFIER MATRIX MEMORY

CROSS REFERENCE TO RELATED APPLICATIONS

This application is a continuation of U.S. patent application Ser. No. 11/780,909, filed Jul. 20, 2007, which is a continuation of U.S. patent application Ser. No. 11/229,941, filed Sep. 19, 2005, now U.S. Pat. No. 7,460,384, which is a division of U.S. patent application Ser. No. 09/887,201, filed on Jun. 22, 2001, now U.S. Pat. No. 6,956,757, which claims the benefit of and priority to U.S. Provisional Patent Application Ser. No. 60/213,419, filed on Jun. 22, 2000, the entire disclosure of each application being hereby incorporated by reference.

CROSS-REFERENCE TO RELATED PATENTS

This application makes references to U.S. Pat. No. 5,889,694 for a "Dual-Addressed Rectifier Storage Device" issued March 1999, to U.S. Pat. No. 3,245,051 for "Information Storage Matrices" issued April 1966, and those patents are hereby incorporated herein by reference.

BACKGROUND OF THE INVENTION

1. Field of the Invention

The present invention relates to semiconductor storage devices, and more particularly to low cost memory resulting from manufacturing efficiencies which construct the devices in three-dimensions and which incorporate efficient testing mechanisms.

2. Description of Prior Art

Many versions of three-dimensional memory arrays have been disclosed in the prior art and they might be classified as being one of two types—stacked chips and layered manufacture.

Layered approaches are discussed in U.S. Pat. Nos. 4,525,921, 4,646,128, and 5,432,729 wherein Carson disclosed a technique for bonding two or more memory chips one on top another to form a three-dimensional memory array. There have been variations on this design, such as by Kato in U.S. Pat. No. 5,051,865, in which he discloses an enhancement comprising heat sink layers which are bonded between memory circuit layers to help reduce overheating.

Of greater interest to the present invention, Zhang, in his U.S. Pat. No. 5,835,396, discloses an approach for manufacturing a layered memory device based on diode storage devices at the intersections of the rows and columns within each layer and Rosner, in his U.S. Pat. No. 4,442,507, discloses an electrically programmable read-only memory. Both of these devices are manufactured upon a semiconductor substrate having decoding logic for the associated bit lines of the memory layers.

However, all of these devices have shortcomings. The bonding of multiple chips creates many points of failure and has high associated assembly costs. Manufacturing devices in layers as disclosed in the prior art has the high cost of the base substrate and its electronic circuitry (manufactured using traditional semiconductor manufacturing means) and its associated complexity as well as the many potential points of failure of interconnecting the vast number of row and column bit lines of the various layers.

What is needed is a three-dimensional memory device which can retain the advantage of lower cost manufacturing by not requiring a base layer comprising the bit line decoding circuitry and the high reliability of few layer interconnects. The present invention accomplishes this by including the decoding circuitry on each memory layer thereby eliminating the need for a base layer comprising bit line decoding circuitry and thereby dramatically reducing the number of layer interconnects to just power and a few address and data lines.

SUMMARY OF THE INVENTION

As advances continue to be made in the area of high density semiconductor storage, the need to keep the cost of these devices low is critical for many applications. Many storage solutions, such as FLASH memory (a non-volatile, rewritable memory technology), are currently very expensive. As a result, many users of FLASH memory must upload and download the contents of their memory to other storage means, such as a computer with a hard disk. This is because FLASH is so expensive that rather than have many FLASH memory devices, users will typically own very few FLASH memory devices which they will reuse depending on their current needs.

The present invention is a means for constructing a high density rectifier matrices (as might be used to construct electronic memory) such that the costs are kept low. By constructing memory devices in three dimensions and integrating simple test circuitry that can rapidly verify the operation of such devices, storage densities can be made very high while keeping testing time (and the associated costs of testing) very low. It is believed that memory devices can be manufactured which will be dramatically lower cost than current technologies.

The present invention also offers advantages over existing technology in that this memory technology could be added to a variety of existing semiconductor devices. Also, a one time programmable variation of the device could be created with little additional effort.

Finally, the present invention also offers advantages over existing technology in that this memory technology, by virtue of its exceptionally simple design, will retain its cost savings even when manufactured three-dimensionally in layers.

DESCRIPTION OF THE PREFERRED EMBODIMENT

The present invention is a means for fabricating semiconductor memory in three dimensions. This memory will be fabricated using a process similar to that used to construct Thin Film Transistor (TFT) flat panel displays—in particular, using deposited semiconductor material on insulating substrates.

Figure 1:
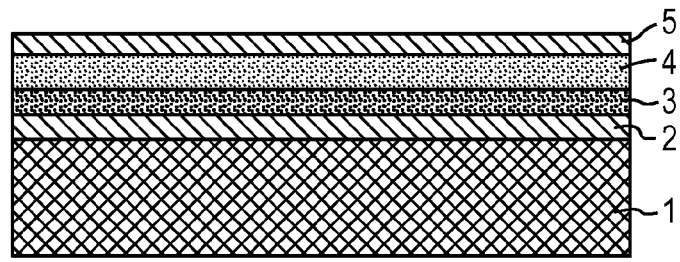
FIG. 1. Illustrates a prepared substrate for the present invention.

Refer now to the figures which show a preferred embodiment of the invention. FIG. 1 shows a possible configuration of a prepared substrate. This substrate consists of a base (1) that is typically made of glass, of Silicon Dioxide on a silicon wafer, or of other insulating material. On top of this is deposited about 1000 Å of metal (2) such as TiAu (Ti-gold), Ni (Nickel), or Al (Aluminum). Next is deposited 250 Å of N+ amorphous Silicon (N+δSi:H) (3) followed by 1000 Å of δSi:H (4). Finally, 100 Å of metal (5) is deposited. It should be noted that the metals and the thicknesses are not critical, so long as certain functional requirements are met. Bottom metal (2) can be made of any material that will form an ohmic contact with the layer (3) above it. Bottom metal (2) should be thick enough to carry enough current to provide the operational speed desired given any circuit capacitances. Layer (4) can be one of many materials that will form an ohmic connection between layers (2) and (4) and need only be thick enough to prevent layers (2) and (4) from interacting in a non-linear way (i.e., not a rectifying contact). Layer (4) can be one of many materials that will form a rectifying contact with top metal layer (5) and need only be thick enough to allow for an adequate junction depth for proper operation of that rectifying contact. Top metal (5) can be made of any material that will form a rectifying contact with the layer (4) below it and need not be very thick because additional metal will be deposited directly on top of this in a later step. Finally all thicknesses must be thin enough to not create unacceptable aspect ratios (i.e., very tall, thin rows that are too tall for their widths), given the design feature size, when these layers are etched as described below.

Figure 2:
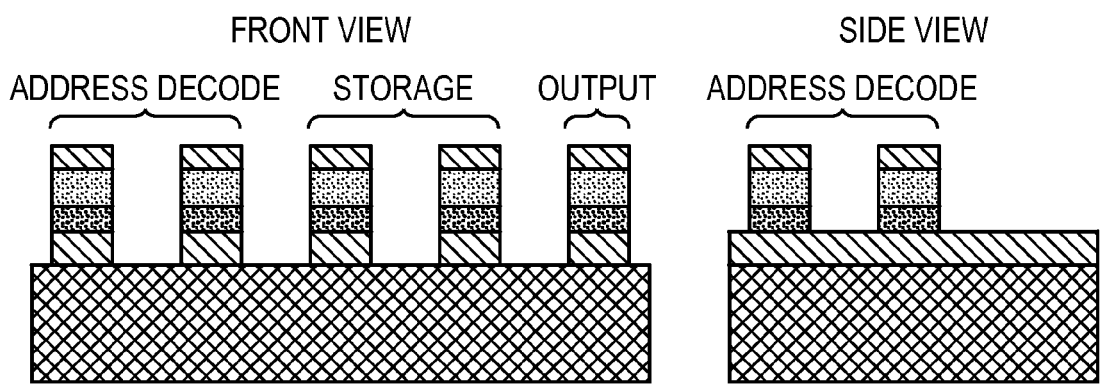
FIG. 2. Illustrates a front and side view after etching rows.

FIG. 2 shows the device following etching steps that result in many parallel rows having many "towers" of rectifiers on each of them. The width of these rows must be proportional to the thickness of the substrate layers so that the aspect ratio are manageable; if the rows or towers are too tall, given their footprints, they will fall over. The width of the channels between the rows and towers must be wide enough to minimize interaction of adjacent rows and columns.

Figure 3:
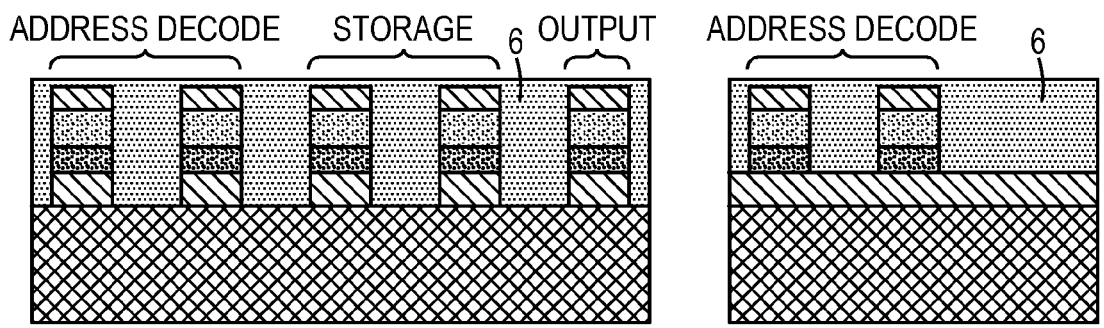
FIG. 3. Illustrates a front and side view of the rows following a passivation step.

FIG. 3 shows the rows following passivation—that is to say, the channels between the rows and columns are filled in with insulating material (6) for structural strength, to provide a smooth surface for subsequent photolithography steps, and to insulate the sides of the rows and columns from the deposition of the top metal layer for the column connections.

Figure 4:
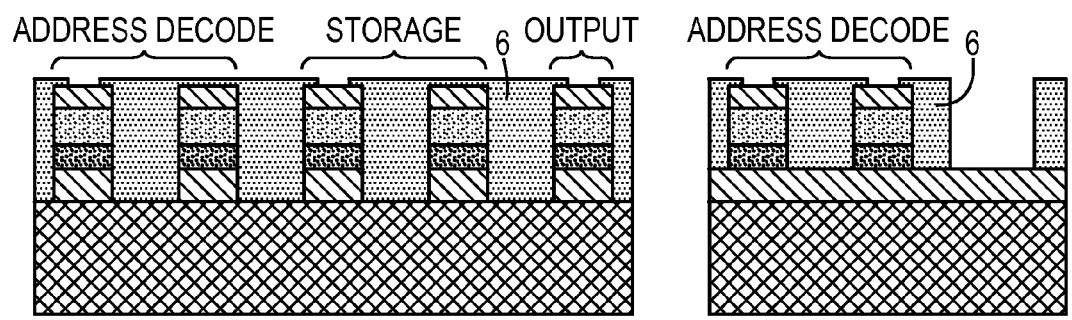
FIG. 4. Illustrates a front and side view of the passivated rows following etching to open contacts through the passivation layer.

FIG. 4 shows the array following an etch to create openings to the towers through insulating material (6) These openings are made selectively in order to program the device according to U.S. Pat. No. 5,889,694. Note that the thickness of the passivated material on top of those towers where no opening is etched must be sufficient to ensure electrical insulation from the top metal layer (yet to be deposited). It should also be noted that all data bit connections could be opened in the case of a programmable or writable device. Such a programmable device might have an additional layer or might otherwise provide for a fusable or antifusable link in each of the towers used for data storage. This additional layer might also be made of a thin-film material that is a phase-change chalcogenide alloy similar to the film used to store information on commercial CD-RW and DVD-RAM optical disks. Note that some of the etches go all the way down to the bottom metal layer (2) to enable the formation of direct connections to the bottom metal rows. Steps 3 and 4 can be partly combined by using a photosensitive spin-on insulator, such as Polyimide, which can be deposited and then photolithographically patterned and developed.

Figure 5:
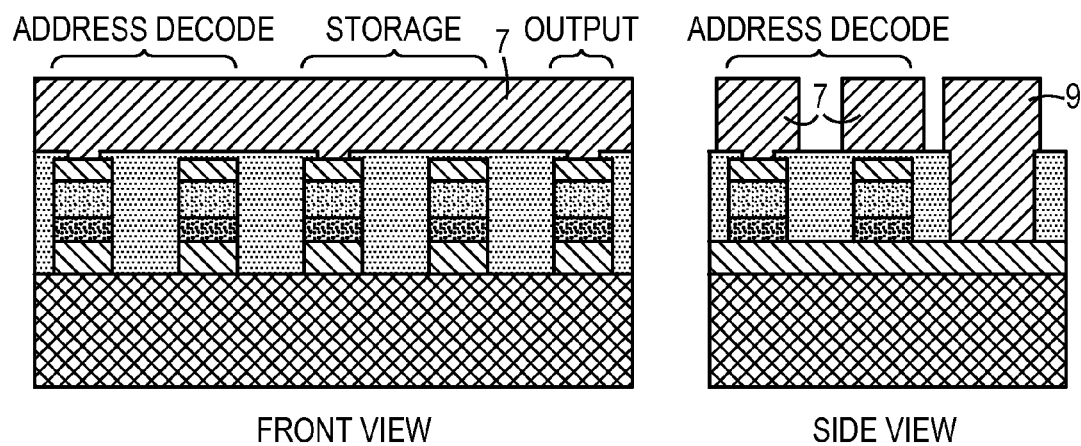
FIG. 5. Illustrates a front and side view of the device following final metallization and etching to create columns.

FIG. 5 shows the final device following the deposition of top metal layer (7) and the etching of that layer into columns orthogonal to the rows. The result of this process will result in a 2 dimensional array of rectifying contacts (in this case, schottky diodes). The rows will be connected by the top metal layer (7) and the columns will be connected by the bottom metal layer (2). This top layer is expected to be about 2000 Å thick, but should be thick enough to carry enough current to provide the operational speed desired given any circuit capacitances without creating any of the previously mentioned aspect ratio problems when the columns are etched.

It is believed that the simplest construction would be as described above utilizing schottky type rectifying contacts. However, many other rectifying structures could be used; the bottom metal layer (2) and top metal contact (5) could be ohmic and the junction between layers (3) and (4) could form the rectifying contact. For example, if layer (3) was doped N+ and layer (4) was doped P+, a P-N rectifying junction could be formed. Alternatively, some other semiconducting material, such as an organic molecule, could be used in place of amorphous silicon. Another variation could include multiple rectifying junctions in series. This might be achieved by constructing a P-N junction and a schottky junction. With this multiple stacked rectifying towers design, if one of the rectifying devices was defective and formed an ohmic connection instead of a rectifying connection, the others in the series would result in the tower still being a rectifying connection between the top column and the bottom row as required for such a rectifier storage matrix.

Figure 6:
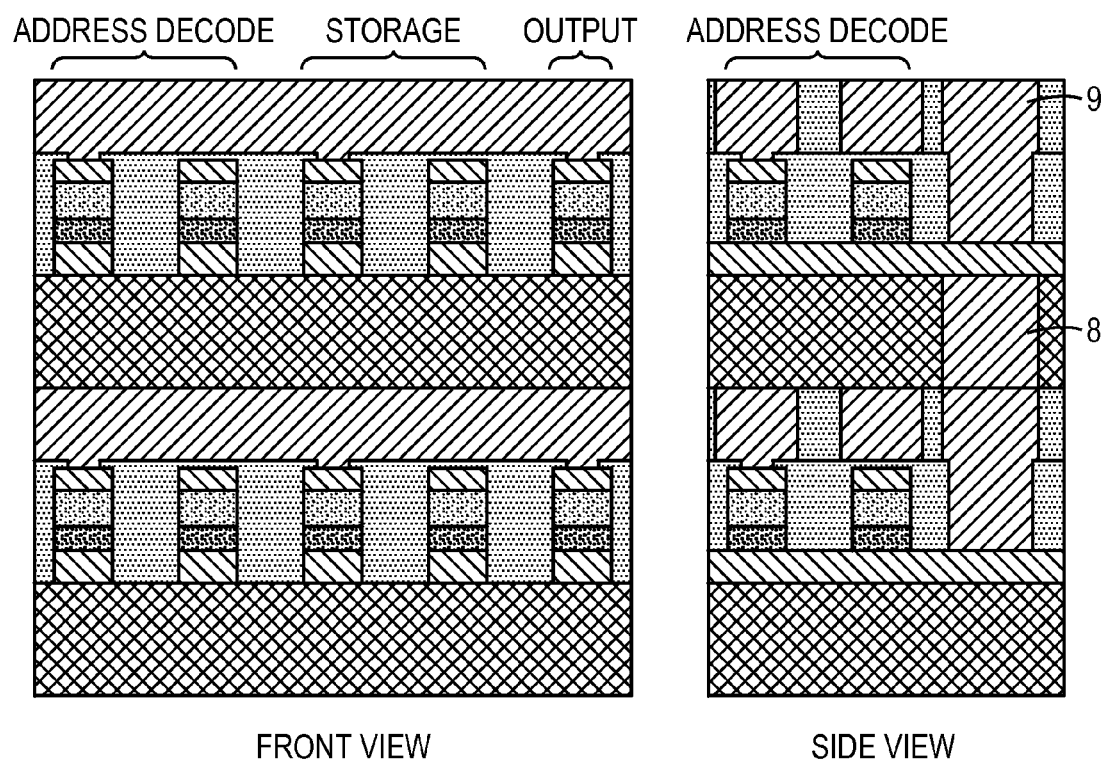
FIG. 6. Illustrates a second layer of the device having been manufactured upon a first layer of the device.

FIG. 6 shows the result of this process if repeated on a substrate which has already had this process performed once. Note that the first layer will most likely be planarized with a polishing step before depositing an insulating film to start the second layer. In the case of the DRS memory constructed in multiple layers, these layers can be wired mostly in parallel (as described in U.S. Pat. No. 5,889,694), only the bonding pads (9) would be interconnected by vias. As can be seen, the structure is identical except for the inclusion of vias (8) to interconnect the bonding points for power, ground and the complementary address inputs of each layer. The data bonding pads would be brought to the surface layer independently so that each data bonding pad would connect to a single layer. Other configurations of wiring are possible. For example, if the data lines of each layer were interconnected by vias and separation was instead accomplished by having some address lines connected to specific layers so as to in effect enable only a single layer at a time and thereby multiplex the data connections. This would be the equivalent of implementing the selective powering of the device as is disclosed in U.S. Pat. No. 5,889,694 whereby each individually powered section of the device was comprised in a separate layer.

Figure 7:
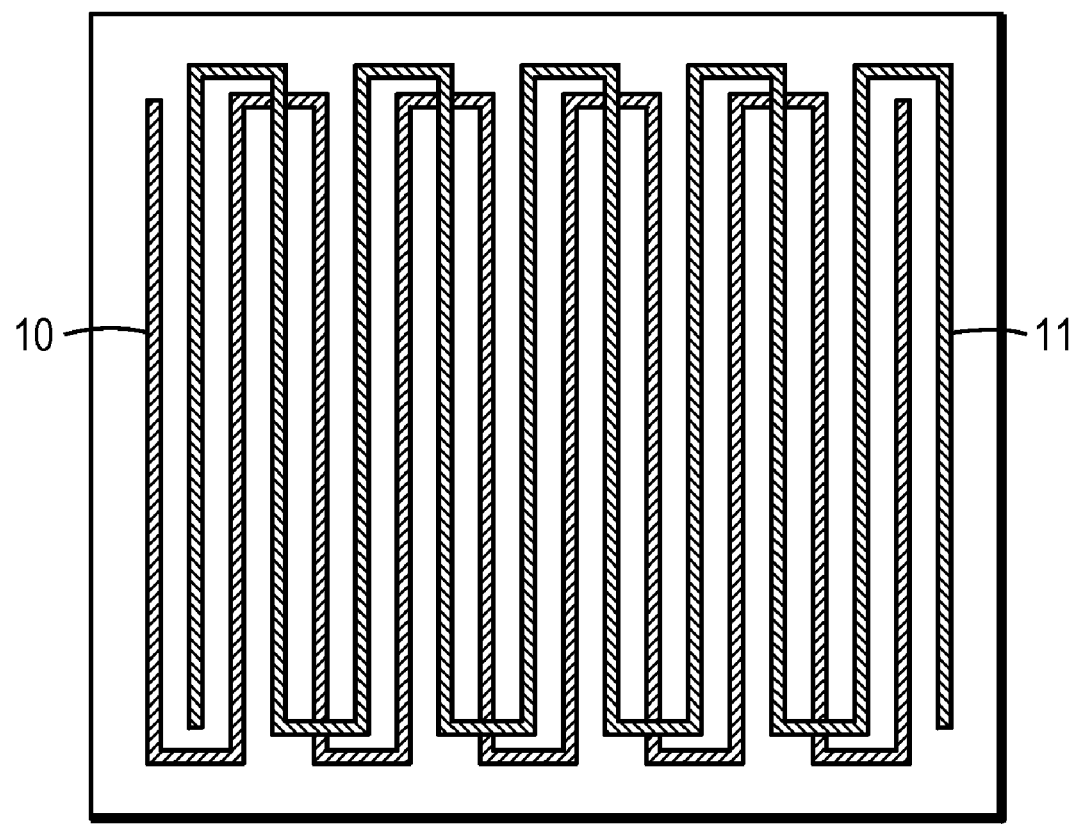
FIG. 7. Illustrates an interconnection pattern for quick testing of the device.

FIG. 7 shows an interconnection technique for the rows (and would be repeated for the columns) to enable the quick and inexpensive testing of the device. The most common faults expected to occur during the fabrication of the present invention are breaks in a line or shorts between two adjacent lines. With the present interconnection technique, all the alternate rows are connected end to end with a top layer connection thereby creating two conductive snakes—one comprising all the even numbered rows (10) and the other comprising all the odd numbered rows (11). By doing so, one can test the device by probing the two ends of each snake and checking for continuity. This will enable instantaneously checking the all the rows for any breaks with just four probe points. Also, shorts between rows can be identified simultaneously by checking for any continuity between the two snakes. The columns would be simultaneously checked in an identical fashion. Also, in the same way and at the same time, the device can be checked for shorts between the top columns and bottom rows (taking care to select one range of voltage levels for the rows and another range of voltage levels for the columns such that the diodes are reverse biased). By combining this test technique with the multiple stacked rectifying towers design, if a device passes this instantaneous test, one can be highly confident of having a working device. After identifying any defective devices (which, if the devices are manufactured inexpensively enough, would most likely just be marked to be discarded), these top layer connections are etched away to separate the lines or the edges of the chips where the interconnections are found could be cut back just enough to remove those edges and their interconnections.

This process is initiated by depositing layers on an insulating substrate such as plastic or glass. But, it should be noted that this insulating substrate does not have to be limited to plastic or glass. As has been shown in the prior art, this process could be performed on top of a normally fabricated semiconductor device such as a memory controller chip, an error detection and correction chip, a data decryption (and, optionally, encryption) chip (such as for security like DES or PGP or for storage efficiency like MP3), or a microprocessor, or the like that has been passivated with a top layer of protecting glass or other insulator. An array of LEDs or diode optical sensors might be constructed upon an image processor to construct a micro display or camera. In its simplest form, a diode matrix (such as was disclosed by Robb in his U.S. Pat. No. 3,245,051, issued in 1965) could be constructed on top of a memory controller comprising the address decoding, the row and column selection logic, the line driver-amplifiers, and the sense amplifiers; in this case, the individual connections to the rows and columns would be made up from the controller substrate. Since a storage array could cover a greater area then, say, a memory controller chip, multiple memory controllers could be placed on the chip to be covered according to the present invention thereby providing redundant controller circuits to operate the storage array, resulting in higher fabrication yields. Furthermore, this process can be performed on top of itself resulting in a three-dimensional construction of this memory device with many layers. One would only then simply have to interconnect the two or more layers with vertical via connections. In the case of the DRS memory constructed in multiple layers, these layers can be wired mostly in parallel; just as the DRS array can be divided into multiple areas on one layer (as described in U.S. Pat. No. 5,889,694), these multiple areas could be constructed vertically with this technique.

Other variations would include the fabrication of integrated memory circuits using other than traditional photolithographic semiconductor manufacturing techniques. By combining lower cost manufacturing techniques with the higher densities resulting from three-dimensional fabrication, the cost per bit can be driven even lower.

The foregoing description of an example of the preferred embodiment of the invention and the variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description, but rather by any claims appended hereto.

What is claimed is:

1. An electronic memory device comprising:
a substrate; and
disposed above the substrate, a plurality of layers of memory circuitry defining a memory array, each layer of memory circuitry comprising a plurality of storage locations,
wherein (i) the memory array is organized as a plurality of individually enableable sub-arrays, and (ii) the substrate comprises at least one of address decoding logic, row and column selection logic, a line driver-amplifier, or a sense amplifier.

2. The electronic memory device of claim 1, wherein, during operation, at least one of the sub-arrays is enabled and at least one of the sub-arrays is not enabled.

3. The electronic memory device of claim 1, wherein each of the plurality of layers corresponds to a sub-array.

4. The electronic memory device of claim 1, wherein the substrate comprises a semiconductor material.

5. An electronic memory device comprising:
a substrate; and
disposed above the substrate, a plurality of layers of memory circuitry defining a memory array, each layer of memory circuitry comprising a plurality of storage locations,
wherein (i) the memory array is organized as a plurality of individually enableable sub-arrays, and (ii) the substrate comprises at least one of error detection and correction logic, data decryption logic, data encryption logic, data compression logic, or data decompression logic.

6. An electronic memory device of comprising:
a substrate; and
disposed above the substrate, a plurality of layers of memory circuitry defining a memory array, each layer of memory circuitry comprising a plurality of storage locations,
wherein (i) the memory array is organized as a plurality of individually enableable sub-arrays, and (ii) each sub-array is individually powered.

7. An electronic memory device of claim 1 comprising:
a substrate; and
disposed above the substrate, a plurality of layers of memory circuitry defining a memory array, each layer of memory circuitry comprising a plurality of storage locations,
wherein (i) the memory array is organized as a plurality of individually enableable sub-arrays, and (ii) the substrate consists essentially of an insulating material.

8. An electronic memory device of claim 1 comprising:
a substrate; and
disposed above the substrate, a plurality of layers of memory circuitry defining a memory array, each layer of memory circuitry comprising a plurality of storage locations,
wherein (i) the memory array is organized as a plurality of individually enableable sub-arrays, and (ii) the substrate comprises a plurality of memory controllers.

* * * * *

UNITED STATES PATENT AND TRADEMARK OFFICE
CERTIFICATE OF CORRECTION

PATENT NO. : 8,358,525 B2  
APPLICATION NO. : 12/898205  
DATED : January 22, 2013  
INVENTOR(S) : Daniel R. Shepard It is certified that error appears in the above-identified patent and that said Letters Patent is hereby corrected as shown below:

In the Claims

At column 6, claim number 6, line number 32, delete "of"

At column 6, claim number 7, line number 41, delete "of claim 1"

At column 6, claim number 8, line number 50, delete "of claim 1"

Signed and Sealed this  
Sixteenth Day of April, 2013

Teresa Stanek Rea  
*Acting Director of the United States Patent and Trademark Office*